United States Patent
Ishizaka (10) Patent No.: US 7,977,235 B2
(45) Date of Patent: Jul. 12, 2011

(54) METHOD FOR MANUFACTURING A SEMICONDUCTOR DEVICE WITH METAL-CONTAINING CAP LAYERS

(75) Inventor: Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 12/363,868

(22) Filed: Feb. 2, 2009

(65) Prior Publication Data

US 2010/0197135 A1 Aug. 5, 2010

(51) Int. Cl.
*H01L 21/4763* (2006.01)
(52) U.S. Cl. .. 438/629; 438/650; 438/670; 257/E21.587
(58) Field of Classification Search ............ 438/629, 438/649, 650, 670; 257/E21.587
See application file for complete search history.

(56) References Cited

U.S. PATENT DOCUMENTS

| | | | |
|---|---|---|---|
| 4,256,816 A | 3/1981 | Dunkleberger |
| 4,659,650 A | 4/1987 | Moritz |
| 4,851,895 A | 7/1989 | Green et al. |
| 4,929,468 A | 5/1990 | Mullendore |
| 4,938,999 A | 7/1990 | Jenkin |
| 5,017,459 A | 5/1991 | McColgin |
| 5,171,610 A | 12/1992 | Liu |
| 5,372,849 A | 12/1994 | McCormick et al. |
| 6,063,705 A | 5/2000 | Vaartstra |
| 6,074,945 A | 6/2000 | Vaartstra et al. |
| 6,303,809 B1 | 10/2001 | Chi et al. |
| 6,319,832 B1 | 11/2001 | Uhlenbrock et al. |
| 6,420,583 B1 | 7/2002 | Lienhard et al. |
| 6,440,495 B1 | 8/2002 | Wade et al. |
| 6,444,263 B1 | 9/2002 | Paranjpe et al. |
| 6,605,735 B2 | 8/2003 | Kawano et al. |
| 6,713,373 B1 | 3/2004 | Omstead |
| 6,989,321 B2 | 1/2006 | Yamasaki et al. |
| 7,107,998 B2 | 9/2006 | Greer et al. |
| 7,264,846 B2 | 9/2007 | Chang et al. |
| 7,270,848 B2 | 9/2007 | Suzuki et al. |
| 7,279,421 B2 | 10/2007 | Suzuki |
| 7,285,308 B2 | 10/2007 | Hendrix et al. |
| 7,459,396 B2 | 12/2008 | Suzuki et al. |
| 2003/0129306 A1 | 7/2003 | Wade et al. |
| 2005/0110142 A1 | 5/2005 | Lane et al. |
| 2006/0113675 A1 | 6/2006 | Chang et al. |
| 2006/0121733 A1 | 6/2006 | Kilpela et al. |

(Continued)

FOREIGN PATENT DOCUMENTS

CA 2206217 11/1998

(Continued)

OTHER PUBLICATIONS

Czekaj, C., et al. Inorganic Chemistry, 1988, 27, p. 8-10.

(Continued)

*Primary Examiner* — Tuan N. Quach (57) ABSTRACT

A method for integrating metal-containing cap layers into copper (Cu) metallization of semiconductor devices. In one embodiment, the method includes providing a patterned substrate containing Cu metal surfaces and dielectric layer surfaces, forming a patterned mask layer on the patterned substrate, where the patterned mask layer contains openings that expose the Cu metal surfaces. The method further includes depositing a metal-containing layer on the Cu metal surfaces, depositing an additional metal-containing layer on the patterned mask layer, and removing the patterned mask layer and the additional metal-containing layer from the patterned substrate to selectively form metal-containing cap layers on the Cu metal surfaces.

19 Claims, 5 Drawing Sheets

U.S. PATENT DOCUMENTS

| | | | |
|---|---|---|---|
| 2006/0131751 A1 | 6/2006 | Minamihaba | |
| 2006/0199372 A1 | 9/2006 | Chung et al. | |
| 2006/0273431 A1 | 12/2006 | He et al. | |
| 2007/0059502 A1 | 3/2007 | Wang et al. | |
| 2007/0284736 A1 | 12/2007 | Yang et al. | |
| 2009/0065939 A1 | 3/2009 | Suzuki | |
| 2009/0072190 A1* | 3/2009 | Kolics | 252/79.1 |
| 2009/0186481 A1 | 7/2009 | Suzuki | |
| 2010/0029071 A1* | 2/2010 | Russell et al. | 438/514 |
| 2010/0181677 A1* | 7/2010 | Edelstein et al. | 257/773 |

FOREIGN PATENT DOCUMENTS

| | | |
|---|---|---|
| EP | 0620291 A1 | 10/1994 |
| JP | 2004146516 | 5/2004 |
| WO | WO 00/12777 | 3/2000 |
| WO | WO0026432 A1 | 5/2000 |
| WO | WO2005034223 A1 | 4/2005 |
| WO | 2006104853 | 10/2006 |

OTHER PUBLICATIONS

Wang et al., Low-temperature chemical vapor deposition and scaling limit of ultrathin Ru films, Applied Physics Letters, Feb. 23, 2004, p. 1380-1382, vol. 84, No. 8, American Institute of Physics, Melville, NY.

Boyd, Edwin P., et al., "Chemical Vapor Deposition of Metallic Thin Films Using Homonuclear and Heteronuclear Metal Carbonyls", Chem. Mater. 1997, 9, pp. 1154-1158.

Green, M.L., et al., "Chemical Vapor Deposition of Ruthenium and Ruthenium Dioxide Films", Journal of the Electrochemical Society, vol. 132, No. 11, pp. 2677-2685, (Nov. 1985).

Cheng, Wei-Yuan, et al., "Initial growth of chemical-vapor-deposited Ru from bis(hexafluoroacetylacetonate)dicarbonyl ruthenium", Thin Solid Films 483 (2005) pp. 31-37.

Gatineau, Julien, et al., "Deposition of highly pure ruthenium thin films with a new metal-organic precursor", Surface and Coatings Technology 201 (2007), pp. 9146-9148.

Bykov, A.F., et al., "Investigation of Thermal Properties of Ruthenium(III) B-Diketonate Precursors for Preparation of RuO2 Films by CVD", Journal of Thermal Analysis, vol. 46 (1996) pp. 1551-1565.

U.S. Appl. No. 12/173,814: Suzuki et al., Method for Forming a Ruthenium Metal Cap Layer, filed Jul. 1, 2005.

U.S. Appl. No. 12/240,894: Ishizaka et al., Method for Forming Ruthenium Metal Cap Layers, filed Sep. 29, 2008.

* cited by examiner

METHOD FOR MANUFACTURING A SEMICONDUCTOR DEVICE WITH METAL-CONTAINING CAP LAYERS

FIELD OF THE INVENTION

The present invention relates to semiconductor processing and semiconductor devices, and more particularly, to a method of integrating metal-containing cap layers into copper(Cu) metallization of semiconductor devices to improve electromigration (EM) and stress migration (SM) in bulk Cu metal.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of Cu metal in multilayer metallization schemes for manufacturing integrated circuits has created several problems that require solutions. For example, high mobility of Cu atoms in dielectric materials and silicon(Si) can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node due to decreasing minimum feature sizes. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials which is directly correlated to adhesion at these interfaces. New materials that provide better adhesion and better EM lifetime have been studied extensively. For example, a cobalt-tungsten-phosphorus (CoWP) layer has been selectively deposited on bulk Cu metal using an electroless plating technique. The interface of CoWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal-containing cap layers that provide good adhesion to Cu metal and improved EM and SM properties of bulk Cu metal. In particular, these methods should provide good selectivity for forming the metal-containing cap layers on Cu metal surfaces compared to dielectric surfaces.

SUMMARY OF THE INVENTION

Embodiments of the invention provide a method for manufacturing semiconductor devices by integrating metal-containing cap layers into Cu metallization to improve electromigration and stress migration in bulk Cu metal. According to one embodiment of the invention, a patterned mask layer is formed on a patterned substrate containing Cu metal surfaces and dielectric layer surfaces. The patterned mask layer contains openings that are aligned with the Cu metal surfaces and allow selective formation of metal-containing cap layers on the Cu metal surfaces by depositing a metal-containing layer on the Cu metal surfaces and an additional metal-containing layer on the surfaces of the patterned mask layer, and removing the patterned mask layer and the additional metal-containing layer.

According to one embodiment of the invention, the method includes providing a patterned substrate containing Cu metal surfaces and dielectric layer surfaces; forming a patterned mask layer on the patterned substrate, the patterned mask layer containing openings that expose the Cu metal surfaces. The method further includes depositing a metal-containing layer on the Cu metal surfaces; depositing an additional metal-containing layer on the mask layer; and removing the patterned mask layer and the additional metal-containing layer from the patterned substrate to selectively form metal-containing cap layers on the Cu metal surfaces.

According to another embodiment of the invention, the method includes providing a patterned substrate containing Cu metal surfaces and dielectric layer surfaces; forming a patterned mask layer on the patterned substrate, the patterned mask layer containing openings that expose the Cu metal surfaces. The method further includes depositing a Ru-containing layer on the Cu metal surfaces; depositing an additional Ru-containing layer on the patterned mask layer; and removing the patterned mask layer and the additional Ru-containing layer from the patterned substrate to selectively form Ru-containing cap layers on the Cu metal surfaces.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide a method for integrating metal-containing cap layers into Cu metallization of semiconductor devices to improve electromigration and stress migration in the devices. The current inventors have realized that although the presence of metal-containing cap layers on Cu metal surfaces is extremely beneficial to the electromigration and stress migration properties of Cu metal layers, the presence of even trace amounts of additional metal-containing material on dielectric layer surfaces adjacent the Cu metal layers is detrimental to the various electrical properties of a semiconductor device. Embodiments of the invention provide a method that avoids formation of additional metal-containing material on the dielectric layer surfaces by using a patterned mask layer that allows deposition of a metal containing layer on the Cu metal surfaces but blocks deposition of the metal-containing material on the dielectric surfaces. Subsequently, the patterned mask layer is removed to yield metal-containing cap layers that are selectively formed on the Cu metal surfaces.

As the minimum feature sizes of semiconductor devices decrease and the thickness of the dielectric layers between adjacent Cu metal layers decreases, electromigration and stress migration problems become increasingly more serious. In one example, a 32 nm minimum feature size device generation may utilize only about 45-50 nm dielectric thickness between adjacent Cu metal layers, and trace amounts of additional metal-containing material on the dielectric layer surfaces can create a current leakage path between the adjacent Cu metal layers, and strongly effect current (I)-voltage (V) and time-dependent-dielectric-breakdown (TDDB) behavior of the semiconductor devices.

Embodiments of the invention provide selective formation of metal-containing cap layers on Cu metal surfaces relative to dielectric surfaces in a semiconductor device. According to one embodiment of the invention, a method for forming a semiconductor device is provided. The method includes providing a patterned substrate containing copper (Cu) metal surfaces and dielectric layer surfaces, and forming a patterned mask layer on the patterned substrate, where the patterned mask layer contains openings that expose the Cu metal surfaces. The method further includes depositing a metal-containing layer on the Cu metal surfaces, and depositing an additional metal-containing layer on the patterned mask layer. The method further includes removing the patterned mask layer and the additional metal-containing layer from the patterned substrate to selectively form metal-containing cap layers on the Cu metal surfaces.

One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" means that a particular feature, structure, material, or characteristic described in connection with the embodiment is included in at least one embodiment of the invention, but do not denote that they are present in every embodiment. Thus, the appearances of the phrases "one embodiment" or "in an embodiment" in various places throughout this specification are not necessarily referring to the same embodiment of the invention.

Figure 1A:
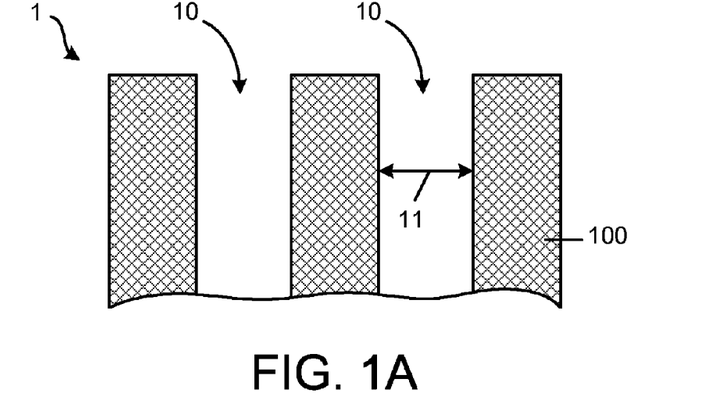
FIGS. 1A-1I show schematic cross-sectional views of formation of metal-containing cap layers in Cu metallization of a semiconductor device according to embodiments of the invention.

FIGS. 1A-1I show schematic cross-sectional views of formation of metal-containing cap layers in Cu metallization of a semiconductor device according to embodiments of the invention. FIG. 1A shows a patterned substrate 1 containing a plurality of recessed features 10 in a dielectric layer 100. The dielectric layer 100 can, for example, contain $SiO_2$, a low dielectric constant (low-k) dielectric material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material, including high dielectric constant (high-k) dielectric materials.

The recessed features 10 may be a part of a high-aspect-ratio interconnect structure. The recessed features 10 can have an aspect ratio (depth/width) greater than or equal to about 2:1, for example 3:1, 4:1, 5:1, 6:1, 12:1, 15:1, or greater. The recessed features 10 have a width 11 that can be less than approximately 500 nanometers ($nm=10^{-9}$ m), for example 250 nm, 200 nm, 150 nm, 100 nm, 65 nm, 45 nm, 32 nm, 20 nm, or smaller. However, embodiments of the invention are not limited to these aspect ratios or feature widths, as other aspect ratios and feature widths may be utilized. It will be understood that embodiments of the invention may be applied to simple and complicated interconnect structures and other types of patterned substrates containing recessed features. According to one embodiment of the invention, the patterned substrate 1 may contain a dual damascene interconnect structure having a trench and a via.

Figure 1B:
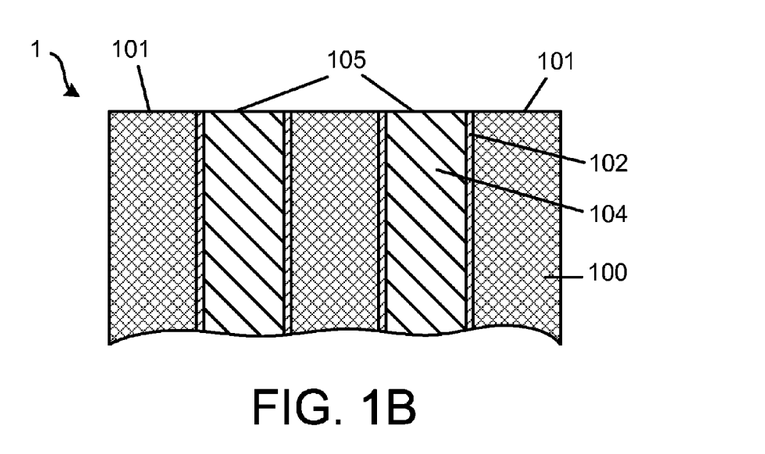

FIG. 1B shows the patterned substrate 1 following further processing that forms a diffusion barrier layer 102 in the recessed features 10 of FIG. 1A, and Cu metal layers 104 filling the recessed features 10. The diffusion barrier layer 102 can, for example, contain a tantalum(Ta)-containing layer (e.g., Ta, TaC, TaN, or TaCN, or a combination thereof), a titanium(Ti)-containing layer (e.g., Ti, TiN, or a combination thereof), or a tungsten(W)-containing layer (e.g., W, WN, or a combination thereof), or a combination of two or more thereof. According to one embodiment of the invention, the diffusion barrier layer 102 may further contain an adhesion layer, e.g., a Ru metal layer or a metal alloy containing Ru metal, in direct contact with the Cu metal layers 104 in the recessed features. In some examples, the diffusion barrier layer 102 and the optional adhesion layer can each have a thickness less than approximately 5 nm. In one example, a thickness of a Ru metal adhesion layer can be approximately 2 nm.

In FIG. 1B, the patterned substrate 1 has been planarized to form Cu metal surfaces 105 and dielectric layer surfaces 101. Cu metal filling of the recessed features 10 may be performed by a Cu plating process, for example by an electrochemical plating process or by an electroless plating process, and the planarization may be performed by chemical mechanical polishing (CMP) following the Cu plating process. The CMP process may be optimized for Cu removal with high selectivity to the dielectric layer 100. The planarization removes excess Cu metal from the patterned substrate 1 following the Cu filling process and further removes the diffusion barrier layer 102 from the dielectric layer surfaces 101. CMP and Cu plating processes are well known to those skilled in the art.

Although not shown in FIG. 1B, residues or contaminants may be present on the dielectric layer surfaces 101 and on the Cu metal surfaces 105 following a CMP process. The contaminants may include oxidized copper on the Cu metal surfaces 105. The residues or contaminants may include benzotriazine (BTA) that is a chemical agent commonly used in a CMP process. The patterned substrate 1 may, for example, be cleaned of the residues or contaminants using thermally excited or plasma excited process gas containing $H_2$, $NH_3$, $N_2$, $NH(CH_3)_2$, $N_2H_4$, or $N_2H_3CH_3$, or a combination thereof.

Figure 1C:
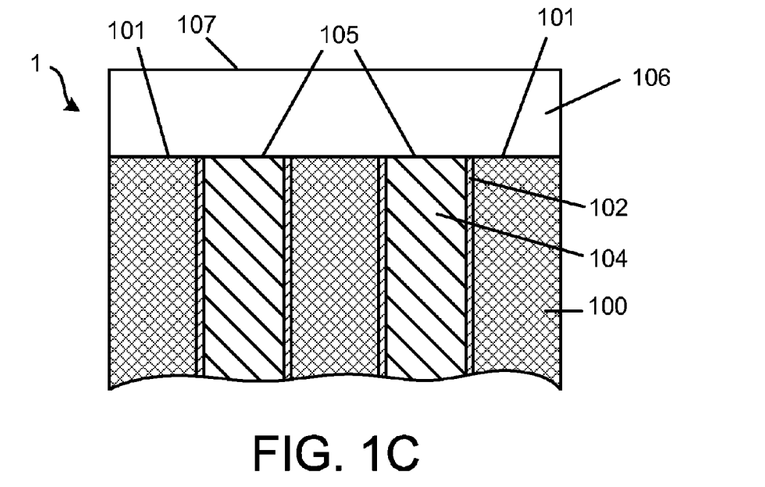

FIG. 1C shows a mask layer 106 formed on the patterned substrate 1, including on the Cu metal surfaces 105 and on the dielectric layer surfaces 101. The mask layer 106 has an upper surface 107 and may be formed by coating the patterned substrate 1 depicted in FIG. 1B with a layer of radiation-sensitive material, for example a layer of photoresist. The layer of radiation-sensitive material may contain deep ultraviolet (DUV) photoresists, extreme ultraviolet (EUV) photoresists, or electron beam (e-beam) resists. DUV resists may be tailored for use with electromagnetic (EM) radiation having wavelength of 248 nm, 193 nm, or 157 nm. DUV lithography is a key enabling technology that can be used to manufacture semiconductor devices with feature widths of 250 nm or less. In other cases, EUV sources can be used for critical dimensions below 50 nm. EUV lithography utilizes EM radiation with wavelengths in a range of about 5 nm to 50 nm, with about 13 nm being the most common.

For example, a photoresist layer may be applied to the patterned substrate 1 using a spin coating technique, such as those processes facilitated by a track system. For example, the track system can comprise a Clean Track ACT 8, ACT 12, or Lithius resist coating and developing system commercially available from Tokyo Electron Limited (TEL), Akasaka, Japan. Other systems and methods for forming a photoresist layer on a substrate are well known to those skilled in the art of spin-on resist technology. Following formation of the mask layer 106 containing a photoresist material, a post application bake (PAB) may be performed to cure the photoresist material.

For example, the photoresist layer may be a chemically amplified resist (CAR). A CAR can be characterized by an acid component, a quenched component, and an inhibitor quencher. CARs were developed to enhance the exposure process because of the low spectral energy of deep ultraviolet (DUV) radiation. A CAR contains one or more components that are insoluble in a developer solution. These components can comprise chemical protectors. A CAR can also contain a photoacid generator (PAG) where, during a radiation exposure step, the PAGs produce acid molecules for the patterning process. Desirably, the acid molecules remain inactive until a post exposure bake (PEB) is performed. The PEB drives a de-protection reaction forward in which the thermal energy causes the acid to react with the chemical protectors.

Figure 1D:
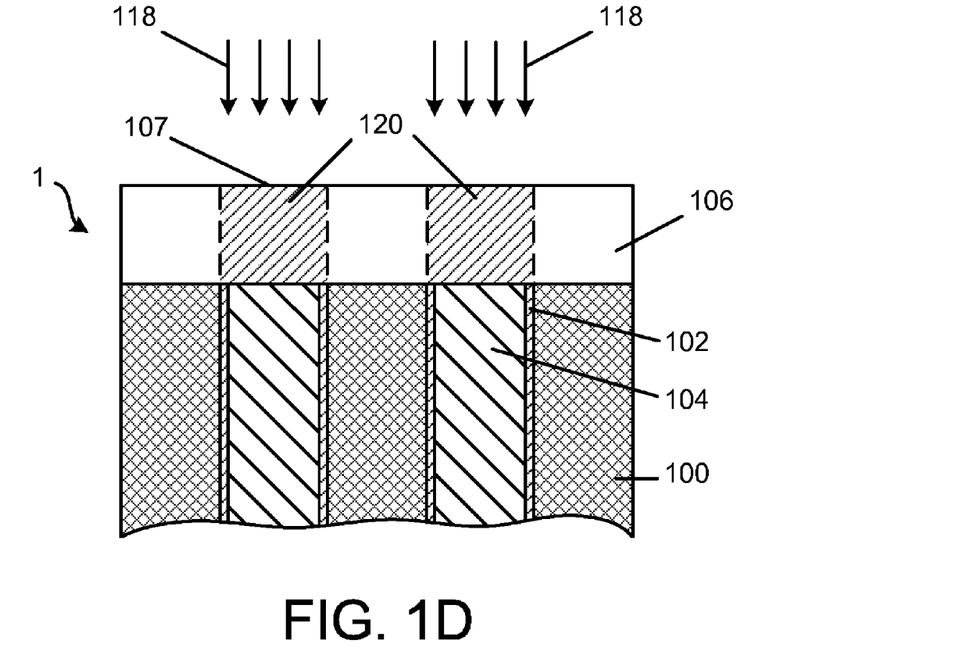

In FIG. 1D, the upper surface 107 of the mask layer 106 is exposed to a radiation pattern 118 using a photolithography system or electron beam lithography system. The exposure to the radiation pattern 118 forms an image pattern 120 through at least a portion of a thickness of the mask layer 106. For example, the radiation pattern 118 may include arrays of EM radiation beams or beams of high-energy electrons that define the size and shape of the image pattern 120. The exposure to the radiation pattern 118 may be performed in a dry or wet photo lithography system, or an electron beam lithography system. The image pattern 120 can be formed using any suitable conventional stepping lithographic system, or scanning lithographic system. For example, a photo-lithographic system is commercially available from ASML Netherlands B. V. (De Run 6501, 5504 D R Veldhoven, The Netherlands), or Canon USA, Inc., Semiconductor Equipment Division (3300 North First Street, San Jose, Calif. 95134).

Following exposure of the upper surface 107 of the mask layer 106 to the EM radiation pattern 118, a PEB may be performed to drive a de-protection reaction forward. Thereafter, the image pattern 120 is developed in a developing solution to remove the material of the image pattern 120 from the patterned substrate 1. An alkaline developing solution, such as a 2.3 wt. % solution of tetramethyl ammonium hydroxide (TMAH), may be used for many photoresists. In addition, rinsing steps can also be performed. The developing process can include exposing the substrate to a developing solution in a developing system, such as a track system. For example, the track system can comprise a Clean Track ACT 8, ACT 12, or Lithius resist coating and developing system commercially available from TEL.

In the example shown in FIG. 1E, the developing process forms openings 116 that extend through the entire thickness of the patterned mask layer 111 below the upper surface 109 and expose the Cu metal surfaces 105. The openings 116 have sidewall surfaces 117 and a width 12 that can be less than approximately 500 nm, for example 250 nm, 200 nm, 150 nm, 100 nm, 65 nm, 45 nm, 32 nm, 20 nm, or smaller. Referring also to FIG. 1A, according to the exemplary embodiment shown in FIG. 1E, the width 12 of the openings 116 can be similar or substantially the same as the width 11 of the recessed features 10 in the dielectric layer 100. In another example, the width 12 can be less than the width 11. In one example, the width 12 can be approximately the same as the width of the Cu metal layers 104.

The exemplary patterning of the mask layer 106 described above describes exposure of the mask layer 106 to an EM radiation pattern 118, followed by removal of the irradiated regions of the mask layer 106 using a developing solution to form openings 116. This is enabled using a positive photoresist. Alternatively, patterning of the mask layer 106 to form openings 116 may be performed using a negative photoresist and a different EM radiation pattern, where removal of non-irradiated regions may be performed using a developing solution.

According to other embodiments of the invention, the mask layer 106 shown in FIG. 1C may, in addition to a resist material, further contain one or more soft mask layers or hard mask layers located below the resist material. In one example, following development of a radiated resist layer, openings may be etched into the one or more underlying soft mask layers or hard mask layers using the developed layer as a mask. For example, the openings may be formed using an etching process such as a dry etching process or a wet etching process. Additionally, for example, the etching process may include a dry plasma etching process, or dry non-plasma etching process. Hard mask layers may be selected from several materials for silicon processing including silicon dioxide ($SiO_2$), silicon nitride ($Si_3N_4$), and carbon.

Figure 1E:
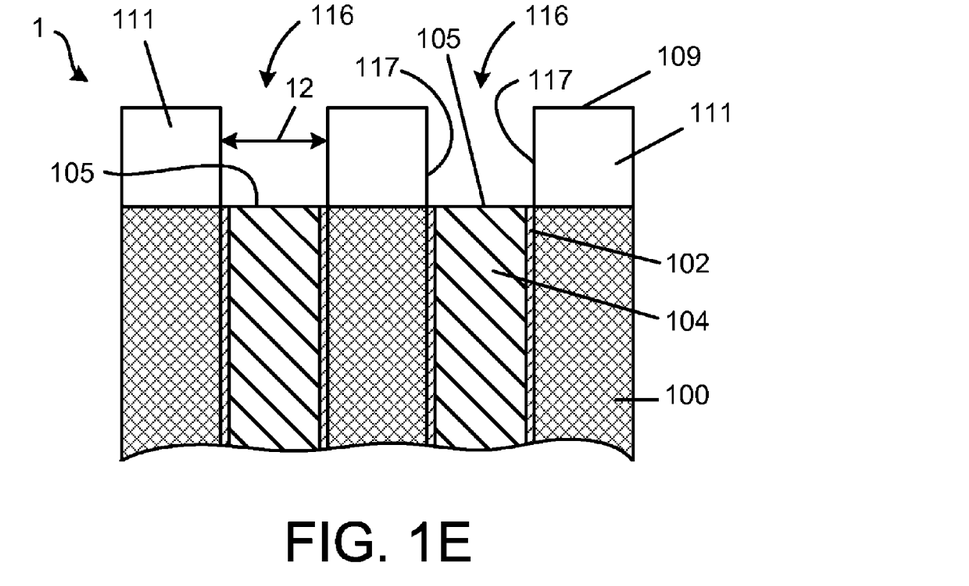

Although not shown in FIG. 1E, contaminants may be present on the Cu metal surfaces 105, the sidewall surfaces 117, and on the upper surface 109. The contaminants can, for example, contain oxidized copper on the Cu metal surfaces 105 and/or non-metal contaminants. The contaminants may form during the developing of the image pattern 120 or during exposure of the patterned substrate 1 to an oxygen-containing atmosphere such as air. The patterned substrate 1 may be cleaned of contaminant as needed to provide Cu metal surfaces 105 that are at least substantially free of copper oxide and other contaminants. The cleaning process can, for example, be performed using thermally excited or plasma excited process gas containing $H_2$, $NH_3$, $N_2$, $NH(CH_3)_2$, $N_2H_4$, or $N_2H_3CH_3$, or a combination thereof.

Figure 1F:
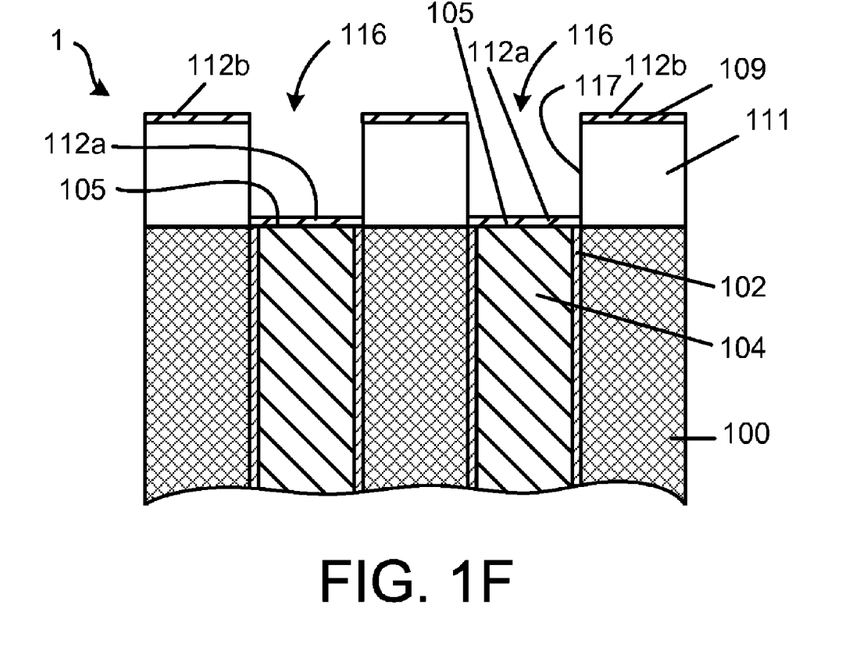
Figure 1G:
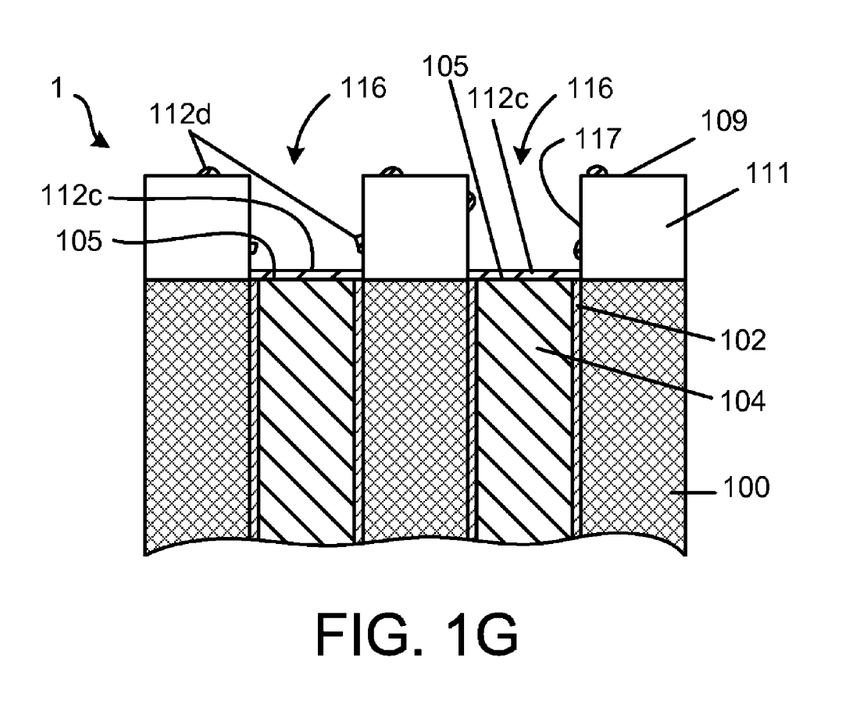

FIGS. 1F-1G show the patterned substrate 1 following deposition of a metal-containing material onto the patterned mask layer 111 in FIG. 1E according to embodiments of the invention.

FIG. 1F shows the patterned substrate 1 following deposition of a metal-containing layer onto the patterned mask layer 111 in FIG. 1E according to one embodiment of the invention. The anisotropic deposition process forms a metal-containing layer 112a on the Cu metal surfaces 105 and an additional metal-containing layer 112b on the upper surface 109 of the patterned mask layer 111. In one example, the anisotropic deposition process may include a physical vapor deposition (PVD) process such as a sputtering process that sputters metal atoms or metal-containing materials from a sputtering target onto the patterned substrate 1. In one example, the anisotropic deposition process may be an ionized PVD (iPVD) process. In another example, the anisotropic deposition process may be a plasma-enhanced chemical vapor deposition (PECVD) process. Although not shown in FIG. 1F, the additional metal containing layer 112b may also be present on the sidewall surfaces 117 since PVD, iPVD, or PECVD processes are not completely anisotropic.

In one example, an average thickness of the metal-containing layer 112a can be between 2 angstrom (angstrom=$10^{-10}$ m) and 200 angstrom, for example about 2, 5, 10, 15, 20, 30, 40, 50, 100, or 200 angstrom. In some examples, the metal-containing layer 112a may have an average thickness between 2 and 5 angstrom. However, embodiments of the invention are not limited to those thicknesses and a metal-containing layer 112a that is thicker than 200 angstrom may be formed. According to one embodiment, a surface coverage of the metal-containing layer 112a on the Cu metal surfaces 105 may be incomplete with gaps that expose the Cu metal surfaces 105.

FIG. 1G shows the patterned substrate 1 following deposition of a metal-containing layer onto the patterned mask layer 111 in FIG. 1E according to another embodiment of the invention. The deposition process can, for example, include chemical vapor deposition (CVD), plasma-enhanced CVD (PECVD), atomic layer deposition (ALD), or plasma-enhanced ALD (PEALD). As depicted in FIG. 1G, the deposition process substantially selectively deposits a metal-containing layer 112c on the Cu metal surfaces 105 and an additional metal-containing layer 112d on the upper surface 109 and on the sidewall surfaces 117 of the patterned mask layer 111. As depicted in FIG. 1G, the additional metal-containing layer 112d may be discontinuous with gaps that expose the upper surface 109 and the sidewall surfaces 117. Deposition by CVD, PECVD, ALD, PEALD can be at least substantially selective to the Cu metal surfaces 105 due to longer incubation times for deposition of the metal-containing material on the upper surface 109 and on the sidewall surfaces 117 than on the Cu metal surfaces 105. Loss of selectivity can, for example, be due to imperfections or damage in the upper surface 109 and sidewall surfaces 117 of the patterned mask layer 111. In another example, deposition of the metal-containing layers 112c and 112d may be performed using a plating process such as an electroless plating process.

Deposition by CVD, PECVD, ALD, PEALD may be performed using a metal-containing precursor selected from Ru-containing precursors, Co-containing precursors, Mo-containing precursors, W-containing precursors, Pt-containing precursors, Ir-containing precursors, Rh-containing precursors, and Re-containing precursors. Exemplary Ru-containing precursors include $Ru_3(CO)_{12}$, (2,4-dimethylpentadienyl)(ethylcyclopentadienyl)ruthenium (Ru(DMPD)(EtCp)), bis(2,4-dimethylpentadienyl) ruthenium (Ru(DMPD)$_2$), 4-dimethylpentadienyl) (methylcyclopentadienyl)ruthenium (Ru(DMPD)(MeCp)), or bis(ethylcyclopentadienyl)ruthenium (Ru(EtCp)$_2$). Exemplary Co precursors include $Co_2(CO)_8$, $Co_4(CO)_{12}$, CoCp $(CO)_2$, $Co(CO)_3(NO)$, $Co_2(CO)_6(HCC^tBu)$, $Co(acac)_2$, $Co(Cp)_2$, $Co(Me_5Cp)_2)$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato)cobalt, and tricarbonyl allyl cobalt. One exemplary Mo precursor is $Mo(CO)_6$. Exemplary W precursors include $W(CO)_6$ and tungsten halides ($WX_6$, where X is a halogen). Exemplary Pt precursors include $Pt(CO)_2Cl_2$, $Pt(acac)_2$, $Me_2PtC_5H_5$, $Pt(PF_3)_4$, and $MeCpPtMe_3$. Exemplary Ir precursors include $Ir_4(CO)_{12}$, $Ir(allyl)_3$, (methylcyclopentadienyl)(1,5-cyclooctadiene) iridium(I), $(C_6H_7)(C_8H_{12})Ir$, and $IrCl_3$. Exemplary Rh precursors include $Rh(acac)(CO)_2$, $(\eta^5-C_5H_5)Rh(H_2C=CH_2)_2$, $(\eta^5-C_5H_5)Rh(CO)_2$, and $RhCl_3$. One exemplary Re precursor is $Re_2(CO)_{10}$. It will be appreciated by those skilled in the art that a number of other metal-containing precursors may be used without departing from embodiments of the present invention.

Figure 1H:
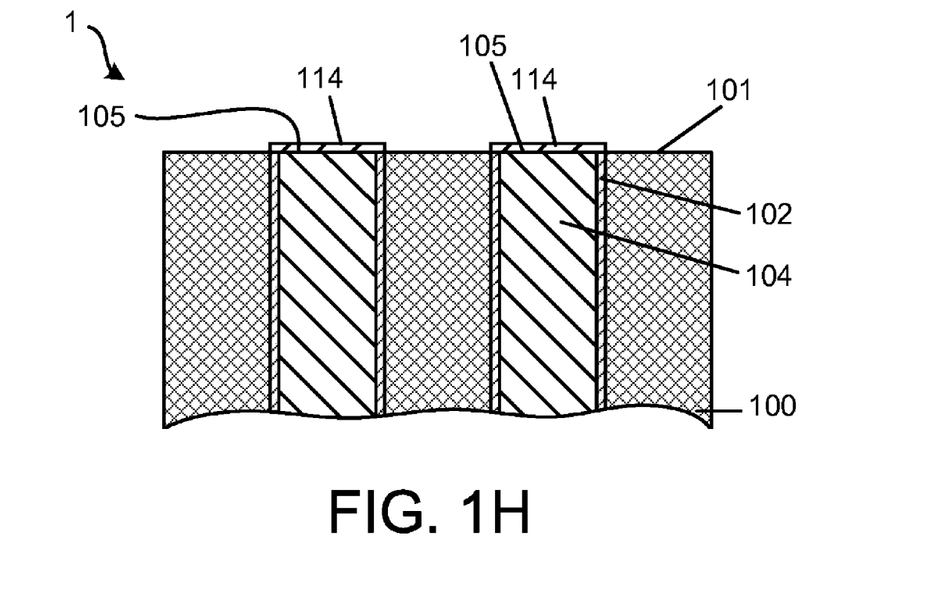

Following the anisotropic deposition of the metal-containing layers 112a, 112b shown in FIG. 1F, or the substantially selective deposition of metal-containing layers 112c, 112d shown in FIG. 1G, the patterned mask layer 111 is removed from the patterned substrate 1 to selectively form metal-containing cap layers 114 on the Cu metal surfaces 105. This is illustrated in FIG. 1H. Removal of the patterned mask layer 111 further removes the additional metal-containing layer 112b in FIG. 1F, or the additional metal-containing layer 112d in FIG. 1G. Removal of the patterned mask layer 111 from the patterned substrate 1 can include a dry ashing process or a wet removal process. The dry ashing process can include exposing the patterned substrate 1 to a thermally excited or plasma excited process gas containing a hydrogen-containing gas, an oxygen-containing gas, a nitrogen- and oxygen-containing gas, or a combination thereof. The hydrogen-containing gas can, for example, include $H_2$, $NH_3$, $N_2$, $NH(CH_3)_2$, $N_2H_4$, or $N_2H_3CH_3$, or a combination thereof. The oxygen-containing gas can, for example, include $O_2$, $H_2O$, or $H_2O_2$, or a combination thereof. The nitrogen- an oxygen-containing gas can, for example, include NO, $N_2O$, or $N_2O$, or a combination thereof.

According to some embodiments of the invention, at least partial removal of the metal-containing layer 112b in 1F, or the metal-containing layer 112d in FIG. 1G may be performed prior to removal of the patterned mask layer 111 from the patterned substrate 1. According to one embodiment of the invention, the at least partial removal may be performed using a wet etching process. The wet etching process can, for example, include exposing the patterned substrate 1 depicted in FIG. 1F or 1G to a wet etching solution. The wet etching solution may be selected from a wide variety of water-based etching solutions and other solutions used in semiconductor manufacturing, including, but not limited to, HF(aq), buffered HF(aq), HCOOH (formic acid), $NH_3+H_2O$, $NH_3+H_2O_2+H_2O$, $HCl+H_2O$, $HCl+H_2O_2+H_2O$, or $H_2SO_4+H_2O_2+H_2O$, or a combination thereof. Exemplary wet etching times are between 5 seconds and 10 minutes, and wet etching solution compositions (by volume) and temperatures may include: $HF+H_2O$ (1:100, 23° C.), $NH_3+H_2O_2+H_2O$ (1:1:20, 60° C.), or $HCl+H_2O_2+H_2O$ (1:1:20, 60° C.).

According to some embodiments of the invention, the metal-containing cap layer 114 cap may contain a metal selected from platinum (Pt), gold (Au), ruthenium (Ru), cobalt (Co), tungsten (W), rhodium (Rh), iridium (Ir), or palladium (Pd), or a combination thereof. In other embodiments, the metal-containing cap layer 114 may contain a metal, for example one or more of the abovementioned metals, and a non-metal dopant. For example, the non-metal dopant may be selected from phosphorus (P), boron (B), nitrogen (N), fluorine (F), chlorine (Cl), bromine (Br), silicon (Si), or germanium (Ge), or a combination thereof.

A non-metal dopant may be incorporated into the metal-containing layers 112a-112d and the metal-containing cap layers 114 cap by simultaneous deposition of a metal and a non-metal dopant using PVD, iPVD, CVD, PECVD, ALD, or PEALD deposition methods. In one example, a metal precursor containing the metal atom to be deposited and a dopant gas containing the non-metal to be deposited may be simultaneously exposed to the patterned mask layer 111. In another example, a metal layer may first be deposited on the patterned mask layer 111 and, subsequently, a non-metal dopant incorporated into at least a thickness of the metal layer. In some embodiments, a dopant gas may be selected from $PH_3$, $BH_3$, $B_2H_6$, $BF_3$, $NF_3$, $NH_3$, $N_2$, $N_2H_4$, $PF_3$, $PBr_3$, $BCl_3$, and $BI_3$. In other embodiments, a non-metal dopant may containing Si, Ge, or a combination thereof. Si-containing dopant gases can include $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, or $Si_2F_6$, and the Ge-containing dopant gases can include $GeH_4$ or $GeCl_4$. According to one embodiment of the invention, a non-metal dopant may be incorporated into at least a thickness of the metal layer by exposing the metal layer to a gas cluster ion beam (GCIB) comprising a dopant gas and optionally an inert gas such as argon (Ar) or helium (He). An exemplary GCIB processing system is described U.S. patent application Ser. No. 12/182,363, entitled "Method of Forming Semiconductor Devices containing Metal Cap Layers", the entire contents of which is herein incorporated by reference. According to other embodiments, a non-metal dopant may be incorporated into at least a thickness of the metal layer by exposing the metal layer to a conventional ion implant beam comprising a dopant gas and optionally an inert gas such as Ar or He.

Figure 1I:
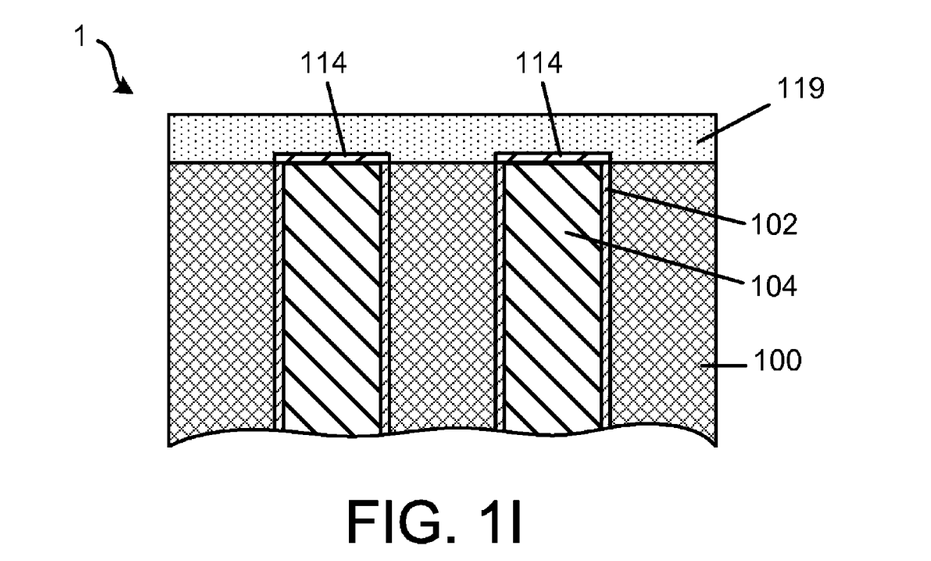

Following the formation of the metal-containing cap layers 114 depicted in FIG. 1H, the partially manufactured semiconductor device may be further processed. FIG. 1I shows a dielectric diffusion barrier layer 119 formed on the metal-containing cap layers 114 and on the dielectric layer surfaces 101. The dielectric diffusion barrier layer 119 can, for example, contain silicon nitride (SiN), silicon carbide (SiC), or silicon carbonitride (SiCN).

Figure 2:
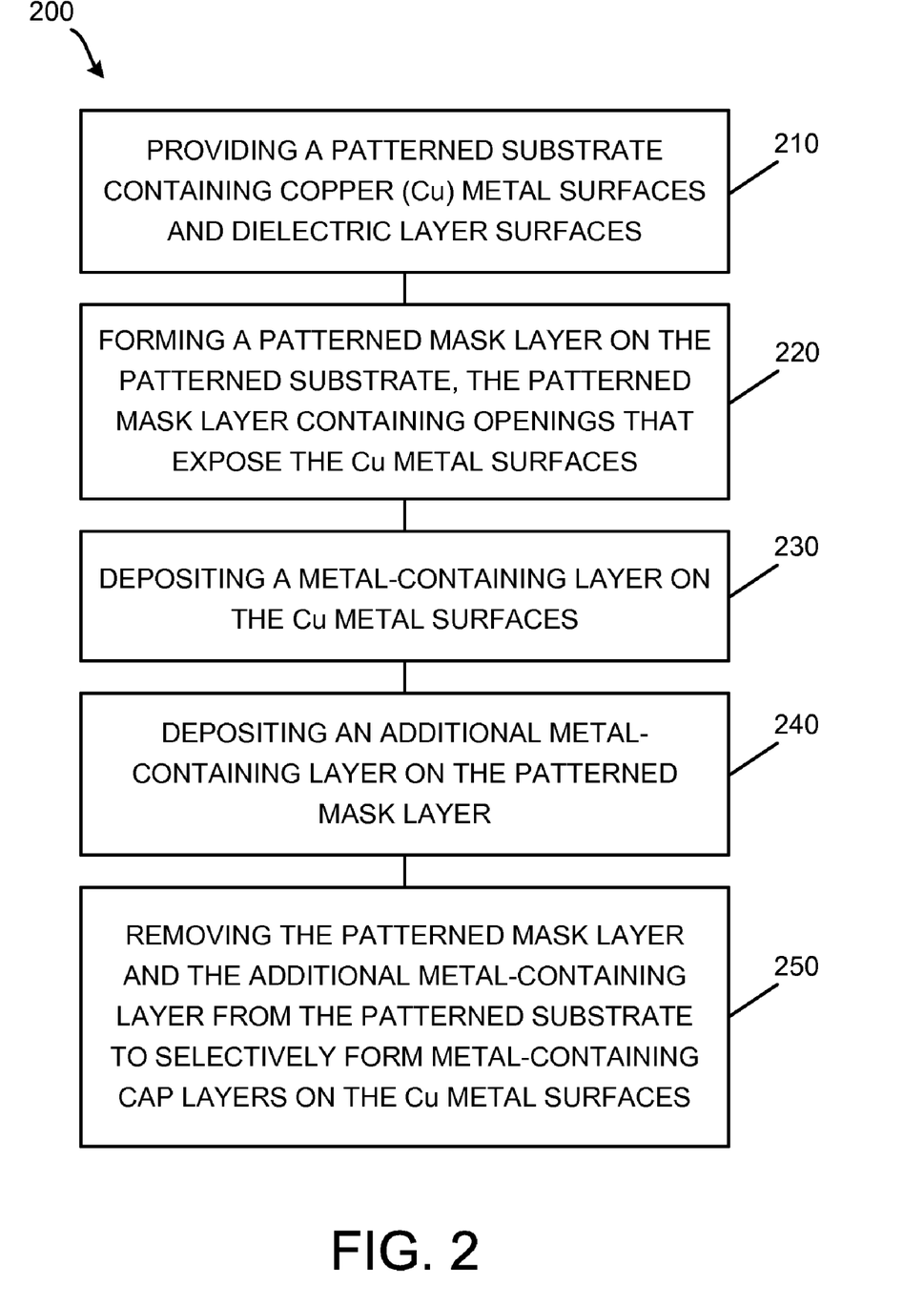
FIG. 2 is a process flow diagram for forming metal-containing cap layers on a patterned substrate according to an embodiment of the invention.

FIG. 2 is a process flow diagram for forming metal-containing cap layers on a patterned substrate according to an embodiment of the invention. The process 200 includes, at 210, providing a patterned substrate containing Cu metal surfaces and dielectric layer surfaces. At 220, a patterned mask layer is formed on the patterned substrate, where the patterned mask layer contains openings that expose the Cu metal surfaces. At 230, a metal-containing layer is deposited on the Cu metal surfaces, and at 240, additional metal-containing layer is deposited on the patterned mask layer. At 250, the patterned mask layer and the additional metal-containing layer are removed from the patterned substrate to selectively form metal-containing cap layers on the Cu metal surfaces.

According to one embodiment of the invention, the metal-containing cap layers 114 cap may contain a Ru-containing material. The Ru-containing material can contain Ru metal, or Ru metal and a non-metal dopant described above. Ru metal may be deposited by a thermal CVD process in a process chamber without the use of a plasma using a process gas containing $Ru_3(CO)_{12}$ precursor vapor and CO carrier gas. An exemplary Ru metal CVD process using a $Ru_3(CO)_{12}$ precursor and a CO carrier gas is described U.S. Pat. No. 7,270,848, the contents of which is herein incorporated by reference. In another example, Ru metal may be deposited by a thermal CVD process utilizing a ruthenium metalorganic precursor. According to other embodiments, Ru metal may be deposited by PECVD, ALD, PEALD, PVD, iPVD, or electroless plating.

Ru-containing cap layers 114 containing both Ru metal and a non-metal dopant may be formed by co-depositing Ru metal and a non-metal dopant. In another example, a Ru metal layer may be deposited first on the patterned mask layer 111, followed by incorporation of a non-metal dopant into at least a portion of the entire thickness of the deposited Ru metal layer. For example, oxygen, nitrogen, or both, may be incorporated by exposing the deposited Ru metal layer to an oxygen-containing plasma, a nitrogen-containing plasma, or a combination thereof. Incorporation of various non-metal dopants into a Ru metal layer is thought to improve the barrier properties of the Ru metal layer against Cu diffusion through the Ru metal layer.

In one example, an average thickness of Ru-containing cap layers 114 can be between 2 Angstrom ($10^{-10}$ m) and 200 Angstrom, for example about 2, 5, 10, 15, 20, 30, 40, 50, 60, 70, 80, 90, 100, or 200 Angstrom. However, embodiments of the invention are not limited to those thicknesses and thicker Ru-containing cap layer 114 may be utilized. For very thin Ru-containing cap layers 114, for example about between 5 Angstrom and 20 Angstrom, the surface coverage of the Ru-containing cap layer 114 on the Cu metal surfaces 105 may be incomplete or discontinuous with gaps that expose the Cu metal surfaces 105.

Referring back to FIG. 1G, deposition of a Ru metal layer 112c on the Cu metal surfaces 105 by a Ru metal CVD process using a $Ru_3(CO)_{12}$ precursor and a CO carrier gas can be at least substantially selective relative to Ru metal deposition on the upper surface 109 and the sidewall surfaces 117 of the patterned mask layer 111. In other words, Ru metal may be preferentially deposited on the Cu metal surfaces 105 compared to on the sidewall surfaces 117 and the upper surface 109 of the patterned mask layer 111. Therefore, initial deposition rate of the Ru metal layer 112c on the Cu metal surfaces 105 is higher than deposition rate of the additional Ru metal 112d on the sidewall surfaces 117 and the upper surface 109 of the patterned mask layer 111. Deposition of the additional Ru metal layer 112d can proceed by loss of deposition selectivity on the Cu metal surfaces 105 relative to on the sidewall surfaces 117 and upper surface 109 of the patterned mask layer 111 during depositing of the Ru metal layer 112c. The initial deposition of the additional Ru metal layer 112d on the patterned mask layer 111 may be delayed due to slow nucleation of the Ru metal atoms on the sidewall surfaces 117 and the upper surface 109 of patterned mask layer 111. The Ru metal deposition on the Cu metal surfaces 105 shows much shorter (or zero) incubation time than on the patterned mask layer 111. Thus, in theory, Ru metal layer 112c may be selectively deposited on the Cu metal surfaces 105 when the deposition is carried out for a duration that is shorter than the incubation time on the patterned mask layer 111. Further, if the deposition process is carried out for a duration that is longer than the incubation time on the upper surface 107 and sidewall surfaces 117, additional Ru metal layer 112d will also be deposited on those surfaces. However, in practice, although the Ru metal deposition is carried out for a duration that is shorter than the incubation time on the upper surface 107 and sidewall surfaces 117, slight loss of selectivity may occur and the additional Ru metal layer 112d may be deposited on those surfaces. This loss of selectivity can, for example, be due to imperfections or damage in the upper surface 107 and sidewall surfaces 117 due to earlier processing steps. This damage may at least in part be caused by the processing that is utilized to form the patterned mask layer 111.

A plurality of embodiments for integrating metal-containing cap layers into manufacturing of semiconductor devices to improve electromigration and stress migration in Cu metallization has been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a patterned substrate containing copper (Cu) metal surfaces and dielectric layer surfaces;
   forming a patterned mask layer on the patterned substrate, the patterned mask layer containing openings that expose the Cu metal surfaces;
   depositing a metal-containing layer on the Cu metal surfaces;
   depositing an additional metal-containing layer on the patterned mask layer; and
   removing the patterned mask layer and the additional metal-containing layer from the patterned substrate to selectively form metal-containing cap layers on the Cu metal surfaces, wherein depositing the metal-containing layer and the additional metal-containing layer comprises:
      depositing a metal layer on the Cu metal surfaces,
      depositing an additional metal layer on the patterned mask layer, and
      thereafter, incorporating a non-metal dopant into the metal layer and into the additional metal layer.

2. The method of claim 1, wherein the metal-containing layer and the additional metal-containing layer contain a metal selected from platinum (Pt), gold (Au), ruthenium (Ru), cobalt (Co), tungsten (W), rhodium (Rh), iridium (Ir), or palladium (Pd), or a combination of two or more thereof.

3. The method of claim 2, wherein the metal-containing layer and the additional metal-containing layer further contain a non-metal dopant selected from phosphorus (P), boron (B), nitrogen (N), fluorine (F), chlorine (Cl), bromine (Br), silicon (Si), or germanium (Ge), or a combination of two or more thereof.

4. The method of claim 1, wherein the incorporating comprises exposing the metal layer and the additional metal layer to a non-metal dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof.

5. The method of claim 4, wherein the incorporating comprises exposing the metal layer and the additional metal layer to a gas cluster ion beam (GCIB) or an ion implant beam containing the dopant gas.

6. The method of claim 1, wherein removing the patterned mask layer comprises a wet removal process or a dry ashing process.

7. The method of claim 1, further comprising
   removing at least a portion of the additional metal-containing layer from the patterned mask layer in a cleaning process prior to removing the patterned mask layer.

8. A method of forming a semiconductor device, comprising:
   providing a patterned substrate containing copper (Cu) metal surfaces and dielectric layer surfaces;
   forming a patterned mask layer on the patterned substrate, the patterned mask layer containing openings that expose the Cu metal surfaces;
   depositing a metal-containing layer on the Cu metal surfaces;
   depositing an additional metal-containing layer on the patterned mask layer, wherein depositing the metal-containing layer and the additional metal-containing layer comprises simultaneously exposing the patterned mask layer and the Cu metal surfaces to a metal-containing precursor gas and a non-metal dopant gas selected from $PH_3$, $BH_3$, $B_2H_6$, $BF_3$, $NF_3$, $NH_3$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof; and
   removing the patterned mask layer and the additional metal-containing layer from the patterned substrate to selectively form metal-containing cap layers on the Cu metal surfaces.

9. The method of claim 8, wherein depositing the metal-containing layer and the additional metal-containing layer comprises depositing a compound of a metal and a non-metal dopant on the patterned mask layer and on the Cu metal surfaces.

10. The method of claim 8, wherein the metal-containing layer and the additional metal-containing layer contain a metal selected from platinum (Pt), gold (Au), ruthenium (Ru), cobalt (Co), tungsten (W), rhodium (Rh), iridium (Ir), or palladium (Pd), or a combination of two or more thereof.

11. The method of claim 8, wherein removing the patterned mask layer comprises a wet removal process or a dry ashing process.

12. The method of claim 8, further comprising
   removing at least a portion of the additional metal-containing layer from the patterned mask layer in a cleaning process prior to removing the patterned mask layer.

13. A method of forming a semiconductor device, comprising:
   providing a patterned substrate containing copper (Cu) metal surfaces and dielectric layer surfaces;
   forming a patterned mask layer on the patterned substrate, the patterned mask layer containing openings that expose the Cu metal surfaces;
   depositing a Ru-containing layer on the Cu metal surfaces;
   depositing an additional Ru-containing layer on the patterned mask layer, wherein depositing the Ru-containing layer and the additional Ru-containing layer comprises:
      depositing a Ru metal layer on the Cu metal surfaces, depositing an additional Ru metal layer on the patterned mask layer, and thereafter, incorporating a non-metal dopant into the Ru metal layer and into the additional Ru metal layer; and removing the patterned mask layer and the additional Ru-containing layer from the patterned substrate to selectively form Ru-containing cap layers on the Cu metal surfaces.

14. The method of claim 13, wherein depositing the Ru-containing layer and the additional Ru-containing layer comprises a thermal chemical vapor deposition (CVD) process using $Ru_3(CO)_{12}$ precursor vapor and CO carrier gas.

15. The method of claim 13, wherein the Ru-containing layer and the additional Ru-containing layer further contain a non-metal dopant selected from phosphorus (P), boron (B), nitrogen (N), fluorine (F), chlorine (Cl), bromine (Br), silicon (Si), or germanium (Ge), or a combination of two or more thereof.

16. The method of claim 13, wherein the incorporating comprises exposing the Ru metal layer and the additional Ru metal layer to a non-metal dopant gas selected from $PH_3$, $BH_3$, $B_2H_6$, $BF_3$, $NF_3$, $NH_3$, $N_2$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof.

17. The method of claim 16, wherein the incorporating comprises exposing the Ru metal layer and the additional Ru metal layer to a gas cluster ion beam (GCIB) or an ion implant beam containing the dopant gas.

18. The method of claim 13, wherein removing the patterned mask layer comprises a wet removal process or a dry ashing process.

19. The method of claim 13, further comprising:

removing at least a portion of the additional Ru-containing layer from the patterned mask layer in a cleaning process prior to removing the patterned mask layer.

* * * * *